United States Patent [19]

Lang et al.

[11] Patent Number: 4,838,988
[45] Date of Patent: Jun. 13, 1989

[54] PROCESS FOR OBTAINING CRYSTALS OF INTERMETALLIC COMPOUNDS, IN PARTICULAR ISOLATED MONOCRYSTALS, BY COOLING ALLOYS IN THE MOLTEN STATE

[75] Inventors: Jean-Marc Lang, La Tronche; Bruno Dubost, St Egrève, both of France

[73] Assignee: Pechiney, Paris, France

[21] Appl. No.: 111,193

[22] Filed: Oct. 22, 1987

[30] Foreign Application Priority Data

Nov. 5, 1986 [FR] France ................................ 86 15774

[51] Int. Cl.$^4$ ............................................ C30B 29/52
[52] U.S. Cl. ........................... 156/624; 156/DIG. 61; 156/DIG. 76; 156/DIG. 71; 156/DIG. 104; 148/13; 148/13.2; 420/400; 420/529
[58] Field of Search ............... 156/601, 616 R, 617 R, 156/617 M, 619, 621, 622, 624, DIG. 61, DIG. 76, DIG. 71, DIG. 104, 617.1, 616.1; 164/122.2; 148/13.2, 438, 13.0, 13.2; 420/529, 400

[56] References Cited

U.S. PATENT DOCUMENTS

| | | | |
|---|---|---|---|
| 1,620,082 | 3/1927 | Czochralski | 148/438 |
| 3,278,342 | 10/1966 | John et al. | 156/624 |
| 3,729,348 | 4/1973 | Saul | 156/624 |
| 3,936,298 | 2/1976 | Mehrabian et al. | 148/438 |
| 3,954,455 | 5/1976 | Flemings et al. | 148/438 |
| 3,981,764 | 9/1976 | Ito et al. | 156/622 |
| 4,013,501 | 3/1977 | Van Vitert et al. | 156/624 |

OTHER PUBLICATIONS

Hardy et al., "The Phase Sections at 500° and 350° C. of Aluminum-Rich Aluminum-Copper-Lithium Alloys", J. Inst. Met., vol. 24, pp. 423-428, (1955).

Sainfort et al., "Metallurgy-'Quasicrystalline' Precipitation from Solid Solutions of the Al-Li-Cu-Mg System", C. R. Acad. Sc. Paris, vol. 301, Series II, pp. 689-690, (1985).

Lyman et al., "Metals Handbook", vol. 1, 8th Ed., American Society for Metals, Ohio, pp. 1, 21.

Primary Examiner—John Doll
Assistant Examiner—R. Bruce Breneman
Attorney, Agent, or Firm—Dennison, Meserole, Pollack & Scheiner

[57] ABSTRACT

The invention relates to a process for obtaining crystals of intermetallic compounds, in particular isolated monocrystals, by cooling alloys in the molten state.

The process involves using an alloy in the molten state which has a composition such that the first phase to crystallize during its solidification corresponds to the compound to be isolated, cooling it slowly by subjecting it to cyclic stirring and thermal cycling without attaining the temperature at which another solid phase appears then abruptly expelling the residual liquid.

The process is used for obtaining large monophase primary crystals of compounds which melt congruently or incongruently, in particular compounds having symmetry of order 5 known as "quasi-crystals".

16 Claims, 1 Drawing Sheet

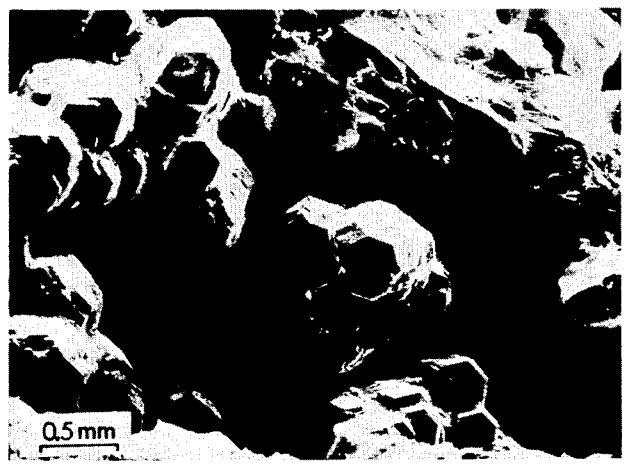
FIG. I

PROCESS FOR OBTAINING CRYSTALS OF INTERMETALLIC COMPOUNDS, IN PARTICULAR ISOLATED MONOCRYSTALS, BY COOLING ALLOYS IN THE MOLTEN STATE

The invention relates to a process for obtaining crystals of intermetallic compounds and, in particular, isolated monocrystals by cooling alloys in the molten state.

The importance of intermetallic compounds in the high performance material industry makes it worthwhile obtaining crystals having dimensions which allow their chemical, crystallographical, mechanical or other properties to be determined. The same applies to certain recently discovered compounds which give rise to crystals having exceptional characteristics such as, in particular, the presence of an axis of quinary symmetry which are known as quasi-crystals.

A person skilled in the art obviously knew of methods for preparing crystals of intermetallic compounds by cooling alloys in the molten state, but these crystals were of reduced size and could be polluted during preparation either by the appearance of eutectic phases or, in the case of compounds which melted in an incongruent fashion, by the intermediate formation of at least one other intermetallic compound resulting from decomposition of the compound already formed.

In the case of the Al-Cu-Li system studied by HK HARDY and JM SILCOCK in J. Inst. Met. 24; 423–428 (1955), the cubic phase R - $Al_5 Cu Li_3$ coated with phase $T_2$ is obtained if an alloy having an atomic composition similar to that of phase $T_2$ with axes of symmetry of order 5 and of quasi-crystalline nature (see P. SAINFORT, B. DUBOST and A. DUBUS, C.R. Acad. Sc, 301, II, 689–692 (1985) is cast.

The applicant has developed the process forming the subject of the present invention with the aim of obtaining intermetallic compounds in the form of large isolated monophase crystals.

This process, which involves cooling an alloy which has previously been completely melted in a heated crucible, is characterised in that an alloy which has a composition such that the first phase to crystallize corresponds to the compound to be obtained is used, when a temperature in the liquidus-solidus range of the alloy is obtained, the liquid is stirred cyclically by subjecting it to a thermal cycle while causing its temperature to drop at a rate lower than 5° C. per minute without attaining the temperature at which another solid phase appears, then the residual liquid is rapidly expelled from the crucible before further crystallisation occurs.

The invention thus involves firstly using an alloy which is placed in a heated crucible so that it is completely liquefied. This alloy does not necessarily have the composition of the compound to be obtained but, in each case, a composition which is such that the first phase to crystallise has the composition of said compound. This composition is inevitably different from that of the intermetallic compound if the intermetallic compound melts incongruently.

Determination of suitable compositions is facilitated by knowledge of the liquid-solid equilibrium charts. Once the composition has been selected, the alloy is completely melted in a crucible then cooled at its periphery until it attains the initial solidification temperature of the alloy. At this moment, crystals of the compound to be obtained settle on the walls of the crucible and, while continuing cooling, the liquid is thus stirred cyclically using any stirrer at the same time as thermal cycling is carried out, that is to say the temperature is varied on either side of the cooling curve corresponding to a reduction of 5° C. per minute. It has in fact been found from experiments that these stirring and thermal cycling operations have the effect of homogenizing the liquid while allowing the growth of large crystals.

This operation is preferably carried out by surrounding the crucible with a thread in which an electric current is transmitted so as to develop electromagnetic pulses. Each pulse is accompanied by a movement of the liquid and a rise in temperature. The liquid becomes calm again and continues to cool between two pulses. Each pulse preferably lasts ten seconds and is separated from the following one by a greater period.

The invention also involves a further stage which is triggered before a solid phase other than that of the compound to be obtained appears and involves rapidly expelling the residual liquid so that no further crystallization occurs. This expulsion is facilitated if the quantity of residual liquid is between 20 and 80% relative to the solid-liquid assembly. Very small fractions of liquid prevent expulsion whereas excessive fractions do not produce sufficiently large and numerous crystals.

A suitable speed of expulsion can be obtained, for example, by rapidly sucking the liquid using a tube which is open at its ends and is immersed partially in the liquid and at the end of which a vacuum pump, for example, is connected by means of a liquid trap.

The invention preferably makes use of an original expulsion means involving firstly completely filling the crucible with the molten alloy and bubbling a soluble gas into the liquid in the crucible, closing it with a lid and placing it in a sealed chamber. As cooling is effected over all faces of the crucible, the crystals grow simultaneously right round the liquid so as to form a continuous crust. Cooling of the side of the lid is limited, however, so that the crust is thinner at this point.

Once the stirring and thermal cycling procedure has been applied to the liquid thus confined during cooling and the quantity of residual liquid is between 20 and 80%, a sudden reduced pressure is applied to the container so that the gas dissolved in the liquid forms a bubble inside the solified portion which escapes abruptly by breaking the thin crust of crystals and shifting the lid while freeing the dendrites from the growing phase. Geodes of the compound to be obtained are thus formed.

The dissolved gas should have high solubility in the alloy and a gas which produces hydrogen in the liquid such as, for example, a moisture-laiden gas is preferably selected. The pressure obtained in the chamber should preferably be below $10^2$ Pa and should be attained in less than 2 minutes.

Under these conditions, the phenomena of peritectic decomposition linked with compounds which melt incongruently, of appearance of eutactic phases and the accompanying pollution are avoided.

The invention can be illustrated by the following embodiments:

An alloy of atomic composition $Al_{6.4} Cu_{0.9} Li_{2.7}$ was melted in a graphite crucible heated to 650° C. in a quantity such that it completely fills the crucible. Some argon having a dew point of 10° C. was bubbled into the liquid for 5 minutes. A lid was then put on the crucible and the unit was placed in a sealed chamber connected to a pumping system. The alloy was cooled so as to pass through the temperature range between 620 and 570° C.

in 8 hours while being subjected to electromagnetic pulses lasting 10 seconds every 30 seconds. The pumping system was brought into operation at a temperature of 570° C. and the pressure was lowered from $10^5$ to $10^2$ Pa in 100 seconds. Monophase (quasi-crystals) of compounds $T_2$- $Al_6$ Cu $Li_3$ having perfectly facetted triacontahedric morphology, dimensions greater than 0.5 mm and of which the electron diffraction figures had quinary symmetry were obtained.

BRIEF DESCRIPTION OF THE DRAWING

FIG. 1 is a photograph of the quasi-crystals, of which the morphology could not be demonstrated by any other known method.

During another test carried out under similar conditions, an aluminum alloy containing 29 % by weight of copper and 9.5% by weight of lithium was used. Crystals of the cubic phase R - $Al_5$ Cu $Li_3$ of centimetric shape with facetting which was visible to the eye along the planes [100] and [110] were obtained.

The compounds obtained are generally facetted and this has the advantage of allowing direct and easy identification of their microstructure or their properties in relation to their crystalline orientation, which is often obvious to a person skilled in the art. They can be used, in particular, as seeds in experiments on oriented crystalline growth or crystallogenesis by controlled solidification of very large monocrystals, employing methods known to a person skilled in the art. A further advantage of the present invention is that it allows monocrystals, in particular of large dimensions (from several tenths of millimetres to several centimetres), to be isolated without the need for long and expensive annealing stages or thermal homogenization treatments (which are generally carried out with cast alloys having the exact composition of the desired compound) or again awkward operations involving selective dissolution of undesirable phases (by chemical or electrochemical means) which generally impairs the surface of the crystals of the investigated compounds.

What is claimed is:

1. In a process for obtaining crystals of an intermetallic compound, comprising the steps of
   completely melting in a crucible an alloy having a composition such that the first phase to crystallize is said intermetallic compound, and cooling said melted alloy to crystallize said intermetallic compound, the improvement comprising:
   cooling said melted alloy to a temperature within the liquidus-solidus range of said intermetallic compound, and subsequently cyclically stirring the melted alloy while subjecting the melted alloy to a plurality of cycles of heating and cooling, while continuing the overall cooling of said melted alloy at a rate of less than 5° C. per minute, without attaining a temperature at which a further solid phase appears, crystals of said intermetallic compound appearing within said liquidus-solidus range; and
   expelling said melted alloy from said crucible before further crystallization can occur.

2. A process according to claim 1, wherein said stirring and cycles are achieved by subjecting the melted alloy to electromagnetic pulses.

3. A process according to claim 2, wherein said pulses are separated by a pause of duration which is greater than the duration of a pulse.

4. A process according to claim 3, wherein the duration of each pulse is 10 seconds and the pause is 20 seconds.

5. A process according to claim 1, wherein the quantity of melted alloy separated is from 20 to 80% by weight relative to the melted alloy and said intermetallic compound.

6. A process according to claim 1, wherein said melted alloy is expelled by overturning the crucible.

7. A process according to claim 1, wherein the crucible is placed in a sealed chamber and completely filled with the melted alloy, the melted alloy is saturated by a gas, the crucible is covered with a lid and cooling is carried out so as to form a thin crust of crystals in contact with the lid and the melted alloy is expelled by suddenly reducing the pressure in the chamber.

8. A process according to claim 7, wherein the gas used generates hydrogen in the liquid.

9. A process according to claim 7, wherein the melted alloy is expelled by reducing the pressure in the chamber below $10^2$ Pa in less than 2 minutes.

10. A process according to claim 1, wherein said melted alloy is expelled by partially immersing a tube which is open at both ends into the alloy and aspirating in the region of the end which is not submerged.

11. A process according to claim 1, wherein the composition of the alloy is different from that of the said intermetallic compound.

12. Process according to claim 1 for obtaining compounds which melt incongruently.

13. Process according to claim 1 for obtaining quasi-crystals.

14. Process according to claim 13 for obtaining quasi-crystals having atomic composition $Al_6$ Cu $Li_3$ of phase $T_2$ having triacontahedric morphology from an alloy having a composition which is less charged with cooper and lithium than that of phase $T_2$.

15. Process according to claim 1 for obtaining crystals having atomic composition $Al_5$ Cu $Li_3$ of cubic phase R.

16. A process according to claim 7, wherein the composition of the alloy is different from that of the said intermetallic compound.

* * * * *